United States Patent
Nishida et al.

(10) Patent No.: US 6,391,108 B2
(45) Date of Patent: *May 21, 2002

(54) LIQUID PHASE GROWTH METHOD OF SILICON CRYSTAL, METHOD OF PRODUCING SOLAR CELL, AND LIQUID PHASE GROWTH APPARATUS

(75) Inventors: Shoji Nishida, Hiratsuka; Katsumi Nakagawa, Atsugi; Noritaka Ukiyo, Atsugi; Masaaki Iwane, Atsugi, all of (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/208,377

(22) Filed: Dec. 10, 1998

(30) Foreign Application Priority Data

Dec. 12, 1997 (JP) .............................................. 9-342709

(51) Int. Cl.$^7$ .............................................. C30B 19/00
(52) U.S. Cl. ......................................................... 117/77
(58) Field of Search .............................. 117/54, 59, 60, 117/64, 67, 73, 78, 79, 934, 77

(56) References Cited

U.S. PATENT DOCUMENTS

| | | | | |
|---|---|---|---|---|
| 4,236,947 A | * | 12/1980 | Baliga .......................... | 148/171 |
| 4,717,688 A | * | 1/1988 | Jaentsch ...................... | 437/120 |
| 4,778,478 A | * | 10/1988 | Barnett ........................... | 437/5 |
| 4,814,842 A | * | 3/1989 | Nakagawa et al. ......... | 357/23.7 |
| 5,053,355 A | * | 10/1991 | Von Campe ................ | 437/114 |
| 5,254,211 A | * | 10/1993 | Yonehara .................... | 156/621 |
| 5,314,571 A | * | 5/1994 | Ciszek ......................... | 117/60 |
| 5,544,616 A | * | 8/1996 | Ciszek et al. ................. | 117/60 |
| 5,575,862 A | | 11/1996 | Nishida ....................... | 136/258 |

FOREIGN PATENT DOCUMENTS

| | | | | |
|---|---|---|---|---|
| DE | 2238205 | * | 8/1972 | ........... C30B/19/00 |
| JP | 58089874 | | 5/1983 | |
| JP | 62036099 | * | 2/1987 | ........... C30B/19/02 |

OTHER PUBLICATIONS

Wolf et al. Silicon Processing for the VLSI Era vol. 1: Process Technology, Lattice Press, Sunset Beach, CA., USA, pp. 14–15, 133–137, 242, 1986.*

* cited by examiner

*Primary Examiner*—Benjamin L. Utech
*Assistant Examiner*—Matthew Anderson
(74) *Attorney, Agent, or Firm*—Fitzpatrick, Cella, Harper & Scinto (57) ABSTRACT

Provided are a liquid phase growth method of silicon crystal comprising a step of injecting a source gas containing at least silicon atoms into a solvent to decompose the source gas and, simultaneously therewith, dissolving the silicon atoms into the solvent, thereby supplying the silicon atoms into the solvent, and a step of dipping or contacting a substrate into or with the solvent, thereby growing a silicon crystal on the substrate; and a method of producing a solar cell utilizing the aforementioned method. Also provided is a liquid phase growth apparatus of a silicon crystal comprising means for holding a solvent in which silicon atoms are dissolved, and means for dipping or contacting a substrate into or with the solvent, the apparatus further comprising means for injecting a source gas containing at least silicon atoms into the solvent. These provide a liquid phase growth method of a silicon crystal and a production method of a solar cell each having high volume productivity and permitting continuous growth.

18 Claims, 4 Drawing Sheets

FIG. 4

LIQUID PHASE GROWTH METHOD OF SILICON CRYSTAL, METHOD OF PRODUCING SOLAR CELL, AND LIQUID PHASE GROWTH APPARATUS

BACKGROUND OF THE INVENTION

1. Field of the Invention

The present invention relates to a liquid phase growth method of a silicon crystal, a method for producing a solar cell, and a liquid phase growth apparatus and, more particularly, to a liquid phase growth method that permits continuous growth and volume production.

2. Related Background Art

Liquid phase growth methods have the advantage of the capability of obtaining crystals with high quality close to stoichiometric compositions because of crystal growth from the quasi-equilibrium state and are used in production of LEDs (light-emitting diodes), laser diodes, and so on, as techniques already established in such compound semiconductors as GaAs. Recently, attempt has been made to utilize the liquid phase growth of Si in order to obtain a thick film (for example, Japanese Patent Application Laid-Open No. 58-89874) and application to solar cells is also under research.

In the conventional liquid phase growth methods, in general, a solution containing a substance for growth as a solute is cooled into a supersaturated state to deposit the excess solute (the substance for growth) on a substrate. On that occasion, it is necessary to preliminarily dissolve the solute into a solvent until saturated, prior to depositing (or growing) the solute on the substrate. Ordinary methods for dissolving the solute into the solvent include one for preliminarily mixing the solute in an amount enough to saturate at a temperature during the dissolution into the solvent and heating the solvent, and one for heating a large amount of a base material of the solute (over a saturation amount) in contact with the solvent and keeping it at the dissolving temperature to saturate. In the former case, a newly weighed amount of the solute is charged into the solvent or the old solvent is replaced by another solvent in which the solute was preliminarily dissolved, after every completion of growth. In the latter case, the base material of the solute is taken into and out of the solvent before or after the growth and the base material will be used up at last to cause some harm in taking it into or out of the solvent or result in an insufficient dissolved amount. Therefore, the old base material needs to be replaced by a new base material. In either case, time loss occurs, because the apparatus is stopped for supplying the raw material when used up or because the growth is suspended. Therefore, the methods according to the conventional techniques had the problem in terms of volume productivity.

The present invention has been accomplished as a consequence of intensive and extensive research by the inventors in order to solve the problem in the conventional techniques as discussed above and an object of the present invention is, therefore, to provide a liquid phase growth method that is simple and easy and that has high volume productivity.

SUMMARY OF THE INVENTION

Therefore, the present invention provides a liquid phase growth method of a silicon crystal comprising a step of injecting a source gas comprising at least silicon atoms into a solvent to decompose the source gas and, simultaneously therewith, dissolving the silicon atoms into the solvent, thereby supplying the silicon atoms into the solvent, and a step of dipping or contacting a substrate into or with the solvent, thereby growing a silicon crystal on the substrate.

Further, the present invention provides a method of producing a solar cell comprising at least a step of forming a silicon layer by liquid phase growth; the method comprising a step of injecting a source gas comprising at least silicon atoms into a solvent to decompose the source gas and, simultaneously therewith, dissolving the silicon atoms into the solvent, thereby supplying the silicon atoms into the solvent, and a step of dipping or contacting a substrate into or with the solvent, thereby growing a silicon crystal on the substrate to form said silicon layer.

Moreover, the present invention provides a liquid phase growth apparatus of a silicon crystal comprising means for holding a solvent in which silicon atoms are dissolved, and means for dipping or contacting a substrate into or with the solvent, the apparatus further comprising means for injecting a source gas comprising at least silicon atoms into the solvent.

Further, the present invention provides a liquid phase growth apparatus of a silicon crystal comprising a solvent reservoir for holding a solvent in which silicon atoms are dissolved, a source gas inlet pipe having an opening portion in the solvent held in the solvent reservoir, a wafer cassette for holding a substrate, the wafer cassette being arranged to be freely taken into or out of the solvent held in the solvent reservoir, and a heater.

Moreover, the present invention provides a liquid phase growth apparatus of a silicon crystal comprising a solvent reservoir and a growth vessel each for holding a solvent in which silicon atoms are dissolved, a pipe for circulating the solvent between the solvent reservoir and the growth vessel, a source gas inlet pipe having an opening portion in the solvent held in the solvent reservoir, a wafer cassette for holding a substrate, the wafer cassette being arranged to be freely taken into or out of the solvent held in the growth vessel, and a heater.

In addition, the present invention provides a liquid phase growth apparatus of a silicon crystal comprising a solvent reservoir for holding a solvent in which silicon atoms are dissolved, a pipe both ends of which are connected to the solvent reservoir and which has an aperture portion except for the both ends, the pipe being provided for circulating the solvent, a source gas inlet pipe having an opening portion in the solvent held in the solvent reservoir, a holding member for holding a substrate so that the substrate is in contact with the solvent at the aperture portion, and a heater.

DESCRIPTION OF THE PREFERRED EMBODIMENTS

Figure 1:
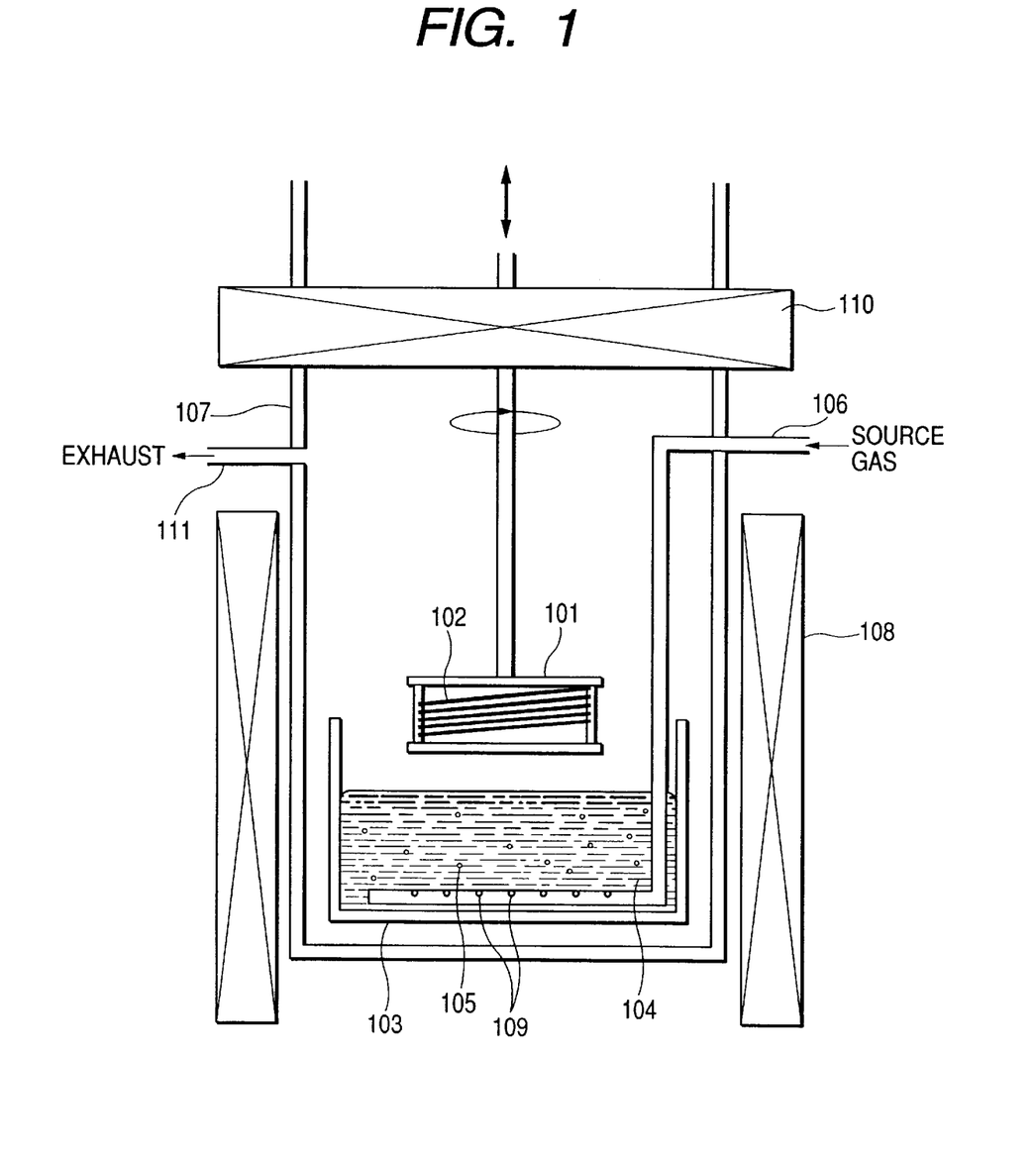
FIG. 1 is a schematic sectional view showing an example of the liquid phase growth apparatus according to the present invention.

An example of the liquid phase growth apparatus, which is used in the liquid phase growth method of the present invention, is illustrated in FIG. 1. In FIG. 1 reference numeral 101 designates a wafer cassette, 102 substrates (wafers), 103 a solvent reservoir (crucible), 104 a solvent (melt), 105 a reaction product gas, 106 a source gas inlet pipe, 107 a reactor tube, and 108 an electric furnace (heater).

Further, numeral 109 denotes gas outlet holes provided in the source gas inlet pipe, 110 a gate valve, and 111 an exhaust port.

The liquid phase growth method and liquid phase growth apparatus of the present invention will be described referring to FIG. 1. As illustrated in FIG. 1, the solvent reservoir (crucible) 103 made of carbon is filled with the solvent comprised of a metal (hereinafter referred to as metal solvent) 104 and the supply pipe 106 for introduction of the source gas is set along the side wall and bottom surface of the crucible 103. The wafer cassette 101 carrying the wafers 102 is located above the crucible 103 and is moved vertically to dip the wafers 102 in the metal solvent 104 or lift the wafers 102 up out of the metal solvent 104, thereby performing growth start operation/growth end operation. The wafer cassette 101 is equipped with a rotating mechanism and the wafer cassette 101 is rotated thereby during growth to uniform thicknesses of a grown film in each wafer surface and thicknesses of grown films among the wafers. The crucible 103, source gas inlet pipe 106, and wafer cassette 101 are housed in the reactor tube 107 and are heated by the electric furnace 108 located outside the reactor 107.

Specific procedures of the liquid phase growth method of the present invention will be described. First, the unsaturated metal solvent, or the metal solvent 104 after an end of growth is heated to a predetermined temperature (a little higher than the growth temperature) and kept thereat before stabilized. Then the source gas, for example $SiH_4$, as a supply source of Si is allowed to flow in the source gas inlet pipe 106, so that the source gas ($SiH_4$) is injected into the metal solvent through the gas outlet holes 109 opening in the surface of the inlet pipe placed at the bottom surface of the crucible, whereupon the source gas ($SiH_4$) comes into contact with the metal solvent. When $SiH_4$ is used as the source gas, the $SiH_4$ coming into contact with the metal solvent soon reacts to be decomposed into Si atoms and $H_2$ molecules. The Si atoms are dissolved into the metal solvent. At this time, the $H_2$ molecules thus evolved agitate the metal solvent to promote the dissolution of the Si atoms into the solvent. It can also be contemplated that the solvent is positively agitated with an agitating mechanism (not illustrated) provided separately. After the $SiH_4$ gas is injected into the metal solvent for a certain time, the flow of the $SiH_4$ gas is stopped and the metal solvent is slowly cooled by controlling the electric furnace 108. When the temperature of the metal solvent reaches the growth start temperature, the wafer cassette 101 is moved down to dip the wafers 102 into the metal solvent 104. Preferably, the wafer cassette 101 is rotated at the rate of several rpm during the growth so as to uniform the thicknesses of grown films. After a lapse of a predetermined growth time, the wafer cassette 101 is moved up out of the metal solvent 104, thereby terminating the growth. Since in the present embodiment the wafers 102 are mounted at a fixed inclination in the wafer cassette 101, there remains little metal solvent 104 on the wafer surfaces when they are drawn up out of the metal solvent 104. There are, however, some cases where a small amount of the metal solvent remains at contact portions (support portions) between the wafers 102 and the wafer cassette 101. In such cases, the wafer cassette is rotated at the rotational speed of several ten or higher rpm, whereby the remaining metal solvent can be thrown off. Subsequently, the wafer cassette is lifted up into a preliminary chamber (not illustrated) separated from the reactor, in which the wafers are exchanged. Then the above steps are repeated, thereby continuously performing liquid phase growth operations.

The feature of the present invention is that the source material can be continuously supplied into the solvent with the source gas kept in contact with the metal solvent, which eliminates the time loss due to the exchange of the base material as the solute and the like in the conventional methods, thereby enhancing the volume productivity.

In the present invention, as the material for the solvent reservoir for storing the metal solvent and as the material for the wafer cassette for supporting the wafers, there is preferably used high-purity carbon or high-purity quartz or the like. Similarly, high-purity carbon or high-purity quartz or the like is also used as a preferred material for the source gas inlet pipe used in the present invention, and high-purity quartz is used as a preferred material for the reactor tube. As the source gas used herein, there are preferably included silanes such as $SiH_4$, $Si_2H_6$, . . . , $Si_nH_{2n+2}$ (n: natural number) and silane halides such as $SiH_2Cl_2$, $SiHCl_3$, $SiCl_4$, $SiH_2F_2$, and $Si_2F_6$.

Further, it is preferable to add hydrogen ($H_2$) to the source gas, as a carrier gas or for the purpose of obtaining a reducing atmosphere to promote the crystal growth. The ratio of amounts of the source gas and hydrogen is properly determined depending upon the forming method, type of the source gas, and forming conditions, and the ratio is preferably not less than 1:1000 nor more than 100:1 (based on the ratio of flow rates of introduced gases) and more preferably not less than 1:100 nor more than 10:1.

As the solvent used in the present invention, a solvent comprised of a metal such as, In, Sn, Bi, Ga, Sb, or the like is preferred. Epitaxial growth is effected by contacting the source gas into the solvent to dissolve the Si atoms thereinto and thereafter slowly cooling the solvent or by providing a temperature difference in the solvent while supplying the Si atoms from the source gas into the solvent.

The temperature and pressure in the liquid phase growth method employed in the present invention differ depending upon the forming method, the type of the source material (gas) used, etc., but the temperature of the solvent is desirably controlled in the range of not less than 600° C. nor more than 1050° C. when silicon is grown using the solvent of Sn or In, for example. The appropriate pressure is generally in the range of $10^{-2}$ Torr to 760 Torr and more preferably in the range of $10^{-1}$ Torr to 760 Torr.

When the conductivity type (the p-type/n-type) of Si needs to be controlled, a gas containing a dopant such as P, B, etc. may be introduced into the solvent as the occasion demands. Further, a solar cell element can be formed by growing a silicon crystal by use of indium as a solvent without addition of a particular dopant to form a silicon layer and thereafter forming an n-type layer, for example, by a method for diffusing the dopant into a part of the silicon layer by such a method as thermal diffusion, ion implantation, or the like.

The growth of a desired crystal by the method of the present invention will be described in more detail using examples, but it should be noted that the present invention is by no means intended to be limited to these examples.

EXAMPLE 1

In the present example an epitaxial layer of Si was grown using the liquid phase growth apparatus of the structure illustrated in FIG. 1. The solvent was In and the source gas was $SiH_4$. While the wafer cassette 101 carrying five 5" Si wafers 102 was kept on standby in a preliminary chamber (not illustrated), the solvent reservoir 103 storing the In solvent 104 was heated by the heater 108 to keep the temperature of the solvent at the constant temperature of 960° C. Here, 5" means that the diameter of the wafers is 5 inches. Then the wafer cassette 101 kept on standby in the preliminary chamber was guided into the reactor 107 while opening the gate valve 110 and it was held immediately above the solvent reservoir 103. The gate valve was kept open thereafter. The source gas $SiH_4$, together with $H_2$ gas (in the ratio of gas flow rates: $SiH_4/H_2=1:1$), was injected through the source gas inlet pipe 106 into the In solvent 104 and these gases were kept flowing for 30 minutes. After the flow of the gases was stopped, the heater 108 was controlled so as to start slowly cooling the solvent in the reactor tube 107 at a rate of −1° C./min. When the temperature of the In solvent 104 reached 950° C., the wafer cassette 101 was moved down into the In solvent 104 while being rotated at the rotational speed of 10 rpm. When the wafer cassette 101 was completely dipped in the In solvent 104, the down movement was stopped and the wafer cassette was held at that position. Then the liquid phase growth was carried on for 60 minutes while rotating the wafer cassette. After that, the wafer cassette 101 was drawn up out of the In solvent 104 and was temporarily stopped immediately above the solvent reservoir 103. Then the rotational speed was increased up to 120 rpm to throw the partly remaining In off the wafer cassette, and the liquid phase growth was completed.

Cross sections of the wafers thus obtained were observed with a scanning electron microscope and a transmission electron microscope and it was verified that the epitaxial silicon layers thus grown had a thickness of about 15 μm and also had good crystallinity.

EXAMPLE 2

Figure 3:
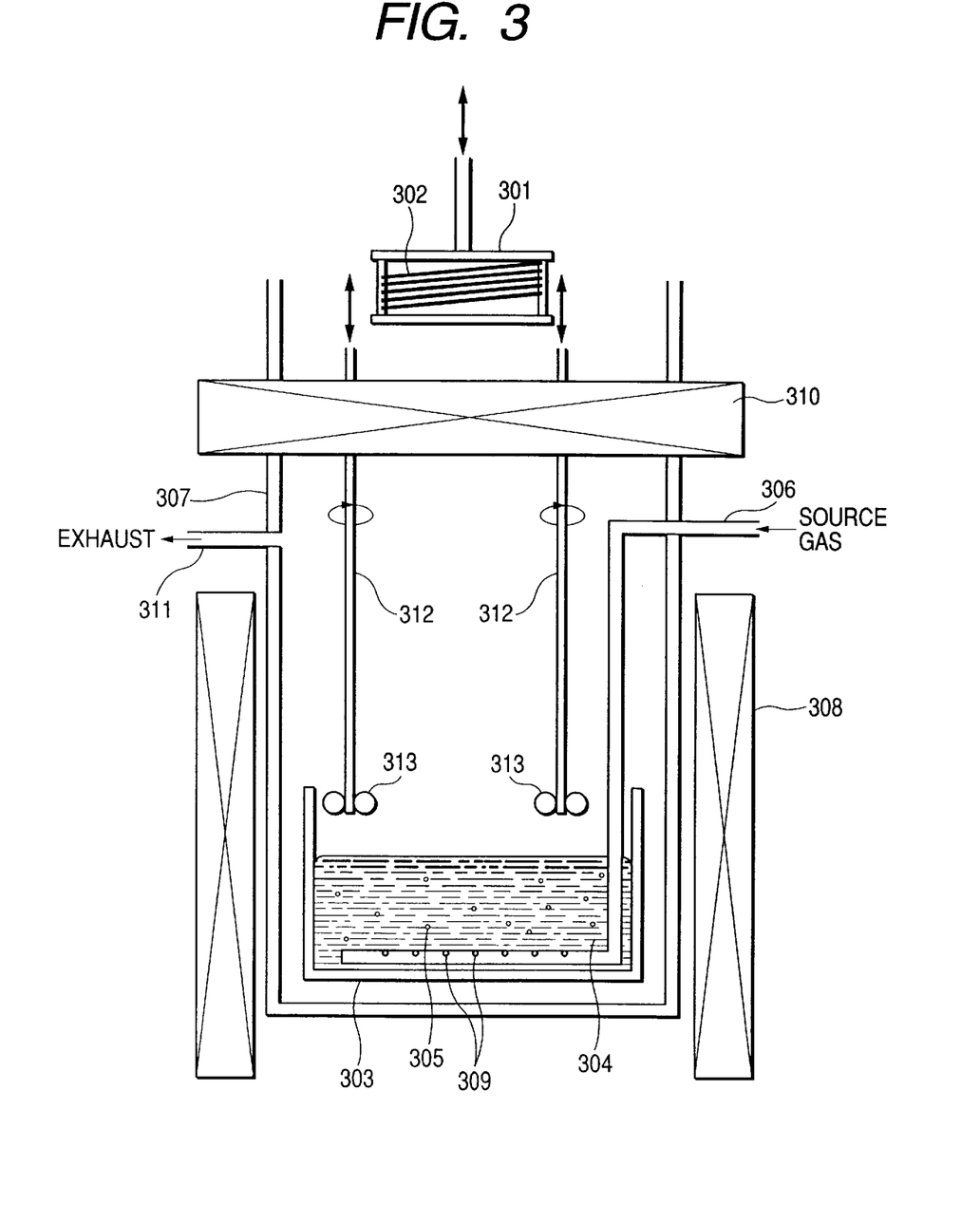
FIG. 3 is a schematic sectional view showing an apparatus having a mechanical agitating means, as an example of the liquid phase growth apparatus according to the present invention.

In the present example an epitaxial layer of Si was grown by using the liquid phase growth apparatus of the structure illustrated in FIG. 3 and using a mechanical agitating means (agitating mechanism) in combination to dissolve the solute in the solvent. The solvent was In and the source gas was $Si_2H_6$. While the agitating mechanism 312 was kept on standby in a preliminary chamber (not illustrated), the solvent reservoir 303 storing the In solvent 304 was heated by a heater 308 to keep the temperature of the solvent at the constant temperature of 960° C. Then the agitating mechanism 312 kept on standby in the preliminary chamber was guided into the reactor tube 307 while opening the gate valve 310 and was held immediately above the solvent reservoir 303. The gate valve was kept opening thereafter. The source gas $Si_2H_6$, together with $H_2$ gas (in the ratio of gas flow rates: $Si_2H_6/H_2=1:1$), was injected through the source gas inlet pipe 306 into the In solvent 304 and the agitating mechanism 312 was moved down into the In solvent 304 while being rotated at a rotational speed of 20 rpm. When the blades 313 of the agitating mechanism were adequately dipped in the In solvent, the down motion was stopped and the agitating mechanism was held at that position. Then the gases were allowed to flow for 30 minutes while agitating the solvent. After the end of the flow of the gases, the agitating mechanism 312 was drawn up to the preliminary chamber and then the wafer cassette 301 carrying five 5" Si wafers 302 this time was guided from a preliminary chamber (not illustrated) into the reactor tube 307 to be held immediately above the solvent reservoir 303 for 10 minutes. Then the heater 308 was controlled to start slowly cooling the solvent in the reactor tube 307 at a rate of −1.5° C./min. When the temperature of the In solvent 304 reached 950° C., the wafer cassette 301 was moved down into the In solvent 304 while being rotated at a rotational speed of 10 rpm. When the wafer cassette 301 was completely dipped in the In solvent 304, the down motion was stopped and the wafer cassette 301 was held at that position. Then the liquid phase growth was carried on for 45 minutes while rotating the wafer cassette. After that, the wafer cassette 301 was lifted up out of the In solvent 304 and was temporarily stopped immediately above the solvent reservoir 303. Then the rotational speed was increased up to 120 rpm, thereby throwing the partly remaining In off the wafer cassette, and the liquid phase growth operation was ended. In FIG. 3 numeral 305 represents the reaction product gas, 309 the gas outlet holes, and 311 the exhaust port.

Cross sections of the wafers thus obtained were observed with a scanning electron microscope and a transmission electron microscope and it was verified that the epitaxial silicon layers thus grown had a thickness of about 15 μm and also had good crystallinity.

EXAMPLE 3

Figure 2:
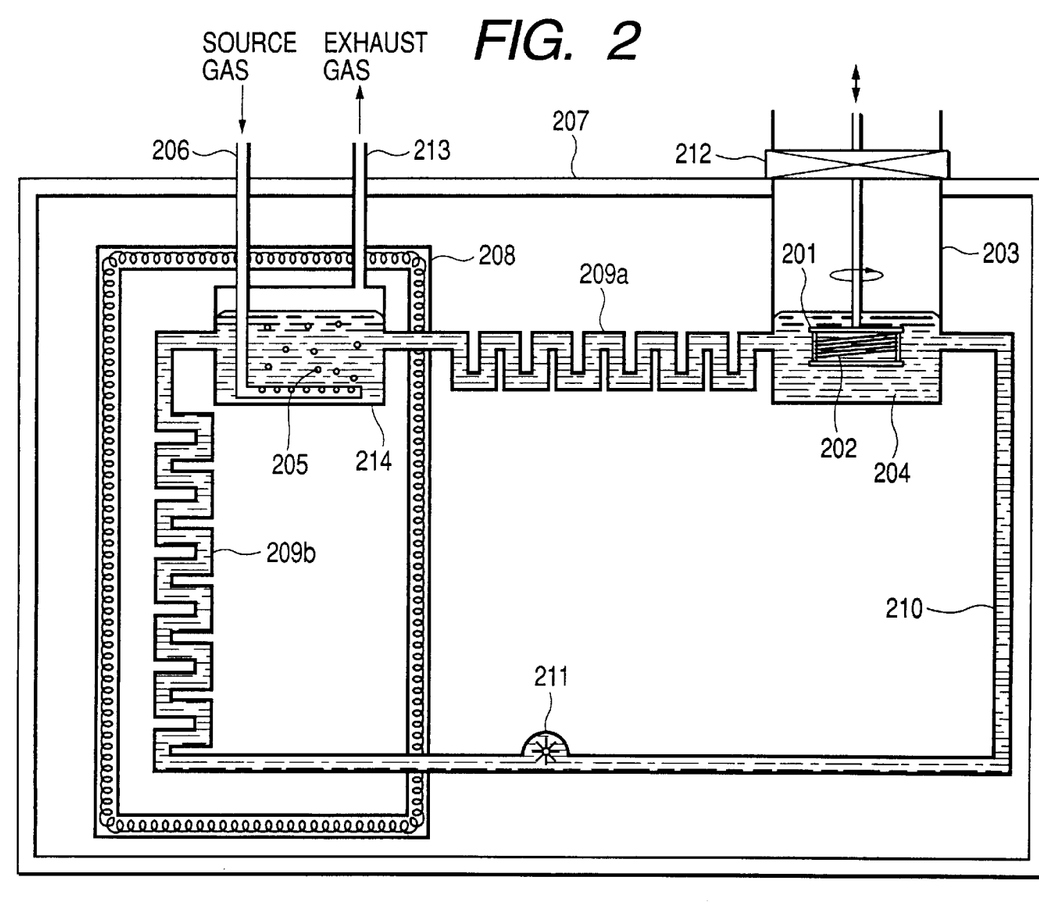
FIG. 2 is a schematic sectional view showing an apparatus that permits the dissolution of silicon and liquid phase growth to be carried out simultaneously, as an example of the liquid phase growth apparatus according to the present invention.

In the present example an epitaxial layer of Si was grown using the apparatus illustrated in FIG. 2.

The solvent was Sn and the source gas was $SiH_2Cl_2$. The apparatus illustrated in FIG. 2 has a solvent reservoir 214 made of quartz, a growth vessel 203 in which a wafer cassette 201 carrying substrates (wafers) 202 are dipped, and quartz pipes 209a, 209b, 210 routed out of one side surface of the solvent reservoir 214, through the growth cell 203, and back to another side surface of the solvent reservoir 214, inside an electric furnace 207. The pipes 209a, 209b serve as heat exchangers. The solvent reservoir 214 and heat exchanger 209b are further surrounded by a heater block 208 so as to be able to control the temperature independently. Numeral 211 designates a rotor for circulation, 212 a gate valve, 206 a source gas inlet pipe, and 213 an exhaust port. Further, numeral 204 is the solvent and 205 the reaction product gas.

The solvent 204 of Sn sufficiently purified in a hydrogen atmosphere was charged into the solvent reservoir 214, growth vessel 203, and quartz pipes 209a, 209b, 210 and the temperature inside the electric furnace 207 was kept at the constant temperature of 950° C. The temperature of the solvent reservoir 214 was set 10° C. higher by the heater block 208 than the temperature inside the electric furnace 207 and outside the heater block 208 and the solvent 204 was circulated by the rotor 211.

After a lapse of a sufficient time, the wafer cassette 201 carrying five 5" p⁺ (100) Si wafers 202 (wafers doped with a relatively large amount of a p-type dopant and having the principal plane of the crystal plane orientation of (100)) was guided from a preliminary chamber (not illustrated) into the growth vessel 203 while opening the gate valve 212 to be held immediately above the Sn solvent 204. The source gas SiH$_2$Cl$_2$, together with H$_2$ gas (in the ratio of gas flow rates: SiH$_2$Cl$_2$/H$_2$=1:5), was injected through the source gas inlet pipe 206 into the Sn solvent 204 in the solvent reservoir 214 and the gases were kept flowing. After a lapse of 30 minutes, the wafer cassette 201 was moved down into the Sn solvent 204 in the growth vessel 203 while being rotated at a rotational speed of 10 rpm. When the wafer cassette 201 was completely dipped in the Sn solvent 204, the down movement was stopped and the wafer cassette was held at that position. Then the liquid phase growth was carried on for 60 minutes while rotating the wafer cassette. Then the wafer cassette 201 was drawn up out of the Sn solvent 204 and was temporarily stopped immediately above the Sn solvent 204. The rotational speed was increased up to 150 rpm to throw the partly remaining Sn off the wafer cassette 201, and the liquid phase growth operation was terminated.

Cross sections of the wafers thus obtained were observed with a scanning electron microscope and a transmission electron microscope and it was verified that the epitaxial silicon layers thus grown had a thickness of about 20 μm and also had good crystallinity.

EXAMPLE 4

Figure 4:
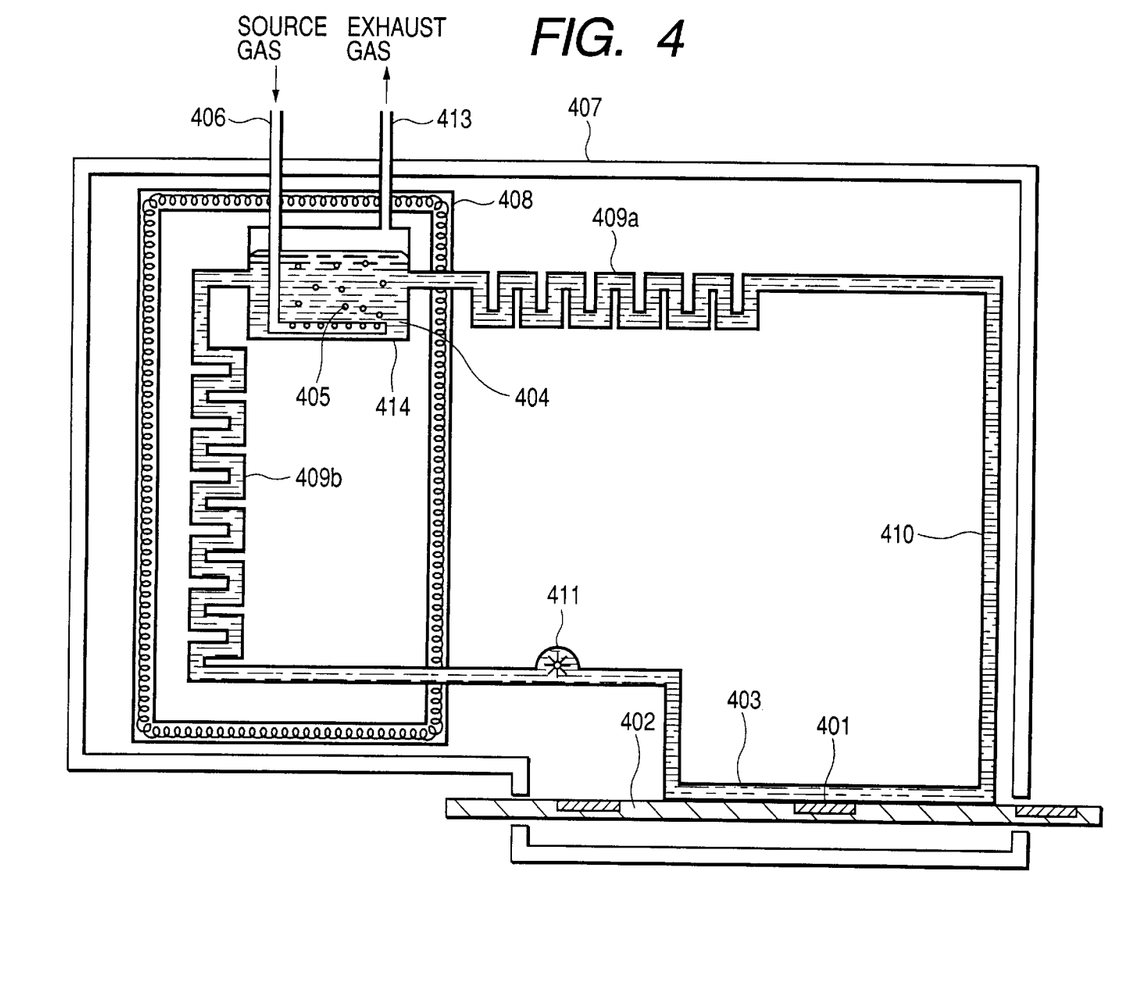
FIG. 4 is a schematic sectional view showing an apparatus in which a substrate is in contact with a solvent at an aperture portion, as an example of the liquid phase growth apparatus according to the present invention.

In the present example an Si layer was grown on polycrystalline Si substrates by use of the apparatus illustrated in FIG. 4. The solvent was In+Ga (Ga content: 0.1 atomic %) and the source gas was SiH$_4$. The substrates were each obtained by processing polycrystalline Si formed by the casting method into the width 40 mm, the length 250 mm, and the thickness 0.6 mm, polishing the surface thereof, and thereafter cleaning it.

The apparatus illustrated in FIG. 4 has a solvent reservoir 414 of carbon, and flat pipes 409a, 409b, 410 made of carbon in an electric furnace 407, the pipes 409a, 409b, 410 being routed so as to leave one side surface of the solvent reservoir 414, contact a slider 402 on which a plurality of substrates 401 are placed, at an aperture portion 403, and then return to another side surface of the solvent reservoir 414. The pipes 409a, 409b serve as heat exchangers. The solvent reservoir 414 and heat exchanger 409b are further surrounded by heater block 408, so that the temperature can be controlled independently. Numeral 411 denotes the rotor for circulation, 406 the source gas inlet pipe, and 413 the exhaust port. Further, numeral 404 represents the solvent and 405 the reaction product gas.

The solvent 404 of In+Ga sufficiently purified in a hydrogen atmosphere was charged into the solvent reservoir 414 and flat pipes 409a, 409b, 410, and the position of the slider 402 was preliminarily adjusted so that the Si substrates 401 were not in contact with the solvent 404 at the aperture portion 403 of the flat pipe. In that state, the temperature inside the electric furnace 407 was kept at the constant temperature of 950° C. and, at the same time, the temperature of the solvent reservoir 414 was set 10° C. higher by the heater block 408 than the temperature inside the electric furnace 407 and outside the heater block 408. The solvent 404 was circulated by the rotor 411. At this time the length of the aperture portion 403 was 100 mm and the circulation rate of the solvent 404 was 40 mm/min. In the present example three Si substrates were placed on the slider.

Then the source gas SiH$_4$, together with the H$_2$ gas (in the ratio of gas flow rates: SiH$_4$/H$_2$=1:1), was injected through the source gas inlet pipe 406 into the In+Ga solvent 404 and the gases were kept flowing. After a lapse of 30 minutes, the slider 402 was conveyed at a conveyance speed of 20 mm/min and the liquid phase growth was effected at the aperture portion 403 with the polycrystalline Si substrate 401 being kept in contact with the In+Ga solvent 404. After all the polycrystalline Si substrates 402 have passed the aperture portion 403, the conveyance of the slider 401 was stopped and the liquid phase growth was ended.

Cross sections of the wafers were observed with a scanning electron microscope and a transmission electron microscope, with the result that the Si layers thus grown had a thickness of about 20 μm. The orientations of the Si layers thus grown were inspected by the ECP (Electron Channeling Pattern) method and it was found that they inherited the crystal orientations of the respective grains of the base polycrystalline Si substrates. The present example verified that the crystalline Si layer was able to be grown continuously while conveying the substrates as described above.

Example 4 described above showed the example using the substrates placed on the slider, but it is also possible, for instance, to bring a web-like substrate having an Si layer attached on a surface thereof into contact with a solvent and convey the substrate in one direction by the roll-to-roll method, thus continuously growing the Si layer.

EXAMPLE 5

In the present example n$^+$/p-type thin-film single-crystal solar cells were made using the liquid phase growth method of the present invention. First, by using the apparatus illustrated in FIG. 1, an epitaxial Si layer was grown on a 500 μm-thick p$^+$ Si wafer (ρ=0.01 Ω·cm) in the similar fashion to Example 1. The epitaxial growth was carried out in the same manner as in Example 1 except that the wafer was different and that the slow cooling rate of the In solvent 104 was −2° C./min.

The thickness of the Si layer thus grown was evaluated by a step gage or the like to be about 30 μm. Then thermal diffusion of P was effected at a temperature of 900° C. on the surface of the Si layer thus grown with a diffusion source of POCl$_3$, thereby forming the n$^+$ layer. The junction depth obtained was about 0.5 μm. The dead layer in the surface of the n$^+$ layer thus formed was wet-oxidized and thereafter removed by etching, thereby obtaining the junction depth of about 0.2 μm with a moderate surface concentration.

In the last place, by EB (Electron Beam) evaporation, a collector electrode (Ti/Pd/Ag (40 nm/20 nm/1 μm)) and an ITO transparent conductive film (82 nm) were deposited on the n$^+$ layer and a back surface electrode (Al (1 μm)) was deposited on the back surface of the substrate, thereby forming the solar cell.

The I–V characteristics of the thin-film single-crystal Si solar cells thus obtained were measured under irradiation with light of AM 1.5 (100 mW/cm$^2$). In the cell area of 6 cm$^2$, typically an open-circuit voltage 0.6 V, a short-circuit current 33 mA/cm$^2$, a fill factor 0.77, and an energy conversion efficiency 15.2% were obtained.

The present invention has enabled to continuously perform the crystal growth without interruption for supply of a source material in the liquid phase growth method of a silicon crystal. The present invention is suitably applicable to volume production methods of devices required to have some thickness, particularly, to those of solar cells.

What is claimed is:

1. A liquid phase growth method of a silicon crystal comprising a step of injecting a source gas comprising at least silicon atoms into a solvent to decompose the source gas and, simultaneously therewith, dissolving the silicon atoms into the solvent, wherein the solvent and the silicon atoms are agitated by a gas evolved by decomposition of the source gas, thereby supplying the silicon atoms into the solvent, and a step of dipping or contacting a substrate into or with the solvent, thereby growing a silicon crystal on the substrate.

2. The method according to claim 1, wherein the source gas contains a dopant.

3. The method according to claim 1, comprising a step of agitating the solvent and the silicon atoms by use of a mechanical means.

4. The method according to claim 1, wherein the solvent is a solvent comprised of a metal.

5. The method according to claim 4, wherein the metal is at least one selected from In, Sn, Bi, Ga, and Sb.

6. The method according to claim 1, wherein the source gas comprises $SiH_4$.

7. The method according to claim 1, wherein the source gas comprises $Si_nH_{2n+2}$ wherein n is an integer of 2 or more.

8. The method according to claim 1, wherein the source gas comprises a silane halide.

9. A method of producing a solar cell comprising at least a step of forming a silicon layer by liquid phase growth, the method comprising a step of injecting a source gas comprising at least silicon atoms into a solvent to decompose the source gas and, simultaneously therewith, dissolving the silicon atoms into the solvent, wherein the solvent and the silicon atoms are agitated by a gas evolved by decomposition of the source gas, thereby supplying the silicon atoms into the solvent, and a step of dipping or contacting a substrate into or with the solvent, thereby growing a silicon crystal on the substrate to form the silicon layer.

10. The method according to claim 9, comprising a step of agitating the solvent and the silicon atoms by use of a mechanical means.

11. The method according to claim 9, further comprising a step of forming an n-type layer, after the step of forming the silicon layer by liquid phase growth.

12. The method according to claim 11, wherein the n-type layer is formed by diffusing a dopant into a part of the silicon layer.

13. The method according to claim 9, wherein the solvent comprises a metal.

14. The method according to claim 13, wherein the metal is at least one selected from In, Sn, Bi, Ga, and Sb.

15. The method according to claim 9, wherein the source gas comprises $SiH_4$.

16. The method according to claim 9, wherein the source gas comprises $Si_nH_{2n+2}$ wherein n is an integer of 2 or more.

17. The method according to claim 9, wherein the source gas comprises a silane halide.

18. The method according to claim 9, wherein the source gas contains a dopant.

* * * * *

UNITED STATES PATENT AND TRADEMARK OFFICE
CERTIFICATE OF CORRECTION

PATENT NO. : 6,391,108 B2
DATED : May 21, 2002
INVENTOR(S) : Shoji Nishida et al.

It is certified that error appears in the above-identified patent and that said Letters Patent is hereby corrected as shown below:

<u>Title page,</u>
Item [56], References Cited, FOREIGN PATENT DOCUMENTS,
"62036099" should read -- 62-36099 --;
"58089874" should read -- 58-89874 --; and
"2238205  8/1972" should read -- 2238205  2/1974 --.

Signed and Sealed this

Tenth Day of December, 2002

JAMES E. ROGAN
*Director of the United States Patent and Trademark Office*